United States Patent [19]

Naruke

[11] Patent Number: 5,002,896
[45] Date of Patent: Mar. 26, 1991

[54] MASK-ROM MANUFACTURING METHOD THAT ENHANCES INTEGRATION DENSITY

[75] Inventor: Yasuo Naruke, Kawasaki, Japan

[73] Assignee: Kabushiki Kaisha Toshiba, Kanagawa, Japan

[21] Appl. No.: 567,797

[22] Filed: Aug. 15, 1990

[30] Foreign Application Priority Data

Aug. 18, 1989 [JP] Japan .................. 1-212522

[51] Int. Cl.$^5$ ............... H01L 21/00; H01L 21/02; H01L 21/265; B01J 17/00
[52] U.S. Cl. ............... 437/48; 437/49; 437/50; 437/52; 357/23.5; 357/23.6; 365/103; 365/104; 365/185
[58] Field of Search .......... 437/41, 48, 49, 50, 437/52, 53; 357/23.6, 23.14, 24, 24 L R, 23.5; 365/94, 102, 103, 104, 185

[56] References Cited

U.S. PATENT DOCUMENTS

| | | | |
|---|---|---|---|
| 4,264,965 | 4/1981 | Onishi | 357/23.14 |
| 4,622,567 | 11/1986 | Pals et al. | 357/23.14 |
| 4,627,153 | 12/1986 | Masuoka | 437/52 |
| 4,742,016 | 5/1988 | Rhodes | 437/53 |
| 4,742,027 | 5/1988 | Blanchard et al. | 437/53 |
| 4,774,203 | 9/1988 | Ikeda et al. | 437/49 |
| 4,818,716 | 4/1986 | Okuyama et al. | 437/49 |
| 4,898,840 | 2/1990 | Okuyama | 437/52 |
| 4,904,615 | 2/1990 | Okuyama et al. | 437/49 |

FOREIGN PATENT DOCUMENTS

| | | | |
|---|---|---|---|
| 0068069 | 4/1982 | Japan | 437/50 |
| 0085566 | 5/1983 | Japan | 437/53 |
| 0107564 | 6/1984 | Japan | 357/23.14 |
| 0210663 | 11/1984 | Japan | 357/23.6 |
| 0071273 | 4/1987 | Japan | 437/53 |
| 0280357 | 11/1989 | Japan | 437/53 |

Primary Examiner—Brian E. Hearn
Assistant Examiner—B. Everhart
Attorney, Agent, or Firm—Banner, Birch, McKie & Beckett

[57] ABSTRACT

A manufacturing method of a mask-ROM of two-layered gate electrode structure is provided. With this method, a cell transistor having a first-layered gate is converted into the depletion type according to data to be stored in the following manner. That is, a first conductive layer is insulatively formed over a semiconductor substrate of a first conductivity type, a silicon nitride film is formed on the first conductive layer, a polysilicon film is formed on the silicon nitride film, the polysilicon film is patterned and then altered into a silicon oxide film so as to increase its volume, and the silicon nitride film is patterned with the silicon oxide film used as a mask to form windows for permitting impurity to be doped therethrough. Then, impurity for converting cell transistors into the depletion type according to data to be stored is doped from the windows into the substrate through the first conductive layer.

18 Claims, 10 Drawing Sheets

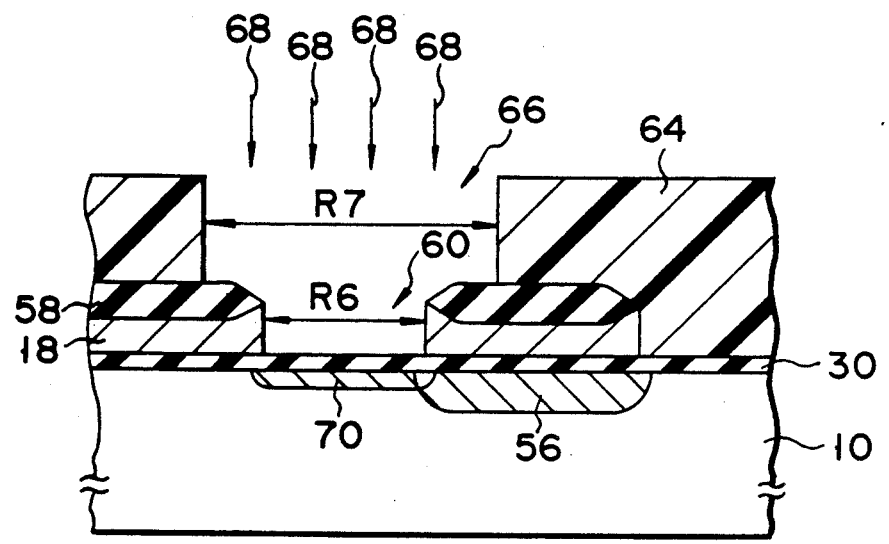
F I G. 6K
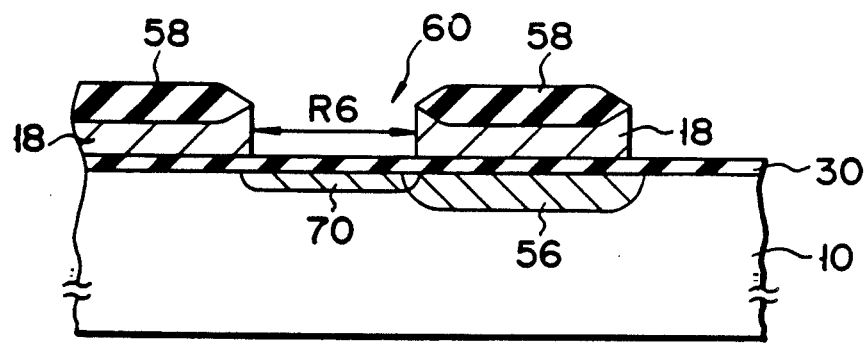
F I G. 6L
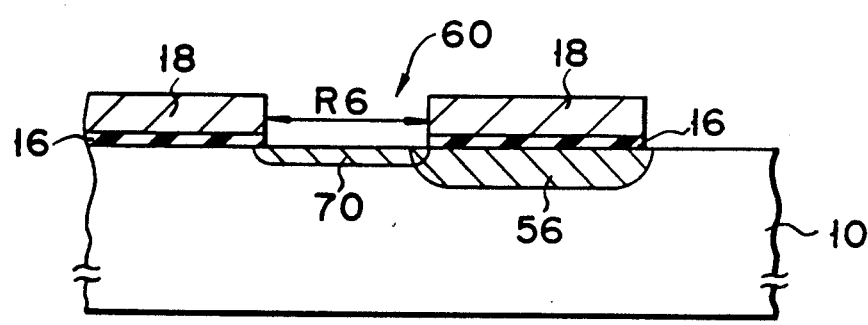
F I G. 6M

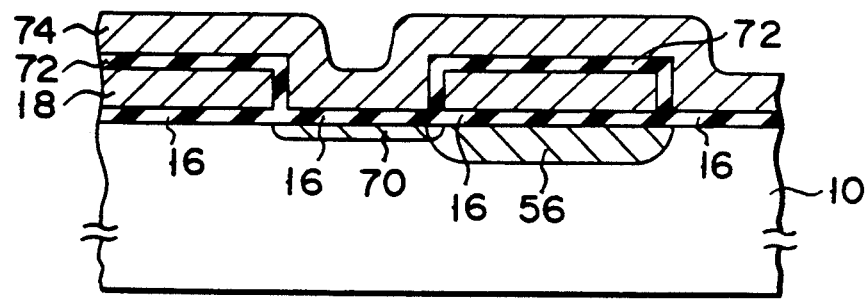
F I G. 6N
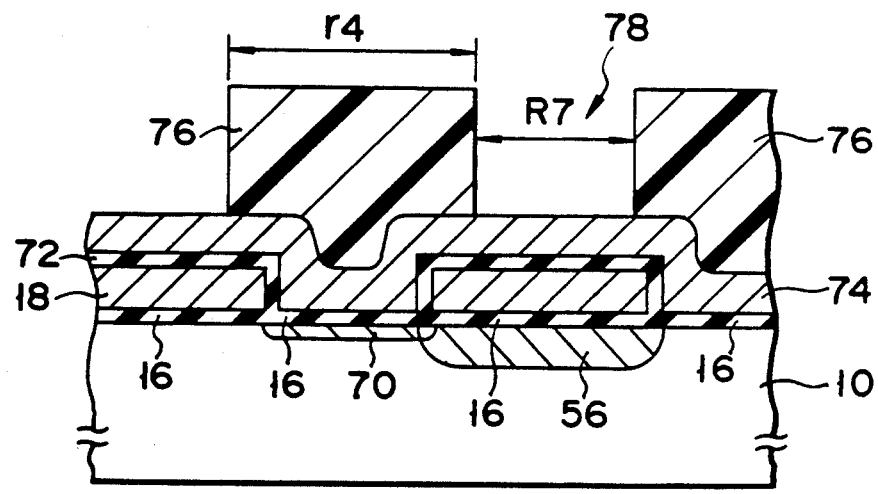
F I G. 6O
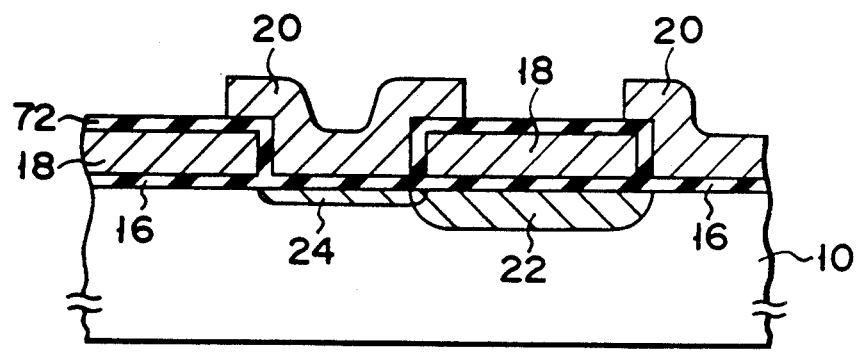
F I G. 6P

MASK-ROM MANUFACTURING METHOD THAT ENHANCES INTEGRATION DENSITY

BACKGROUND OF THE INVENTION

1. Field of the Invention

This invention relates to a mask-ROM manufacturing method, and more particularly to the improvement of a ROM-Implantation step for storing data.

2. Description of the Related Art

Conventionally, a mask-ROM is well known as one of nonvolatile semiconductor memory devices. The mask-ROM is a memory in which data can be stored by, for example, selectively ion-implanting impurity into the channel region of memory cell transistors using a mask alignment technique in the manufacturing process so as to selectively form depletion type cell transistors. For example, the mask-ROM constitutes a logic circuit such as an NAND circuit or NOR circuit according to data stored therein.

FIG. 1 is a cross sectional view of a cell of a NAND type mask-ROM. The memory structure of the mask-ROM shown in FIG. 1 is called a two-layered gate electrode structure using two-layered polysilicon gates.

As shown in FIG. 1, a field oxide film 102 is formed in the surface area of a p-type silicon substrate 100 for element isolation, for example. In the isolated element region, n-type source/drain diffusion layers 104A and 104B are formed. The diffusion layer 104A is electrically coupled to a low potential (GND/VSS), for example, and the diffusion layer 104B functions as a bit line and is electrically coupled to a high potential (VDD), for example. First-layered polysilicon gates 108A to 108N and second-layered polysilicon gates 110A to 110C are formed over that portion of the substrate area which lies between the diffusion layers 104A and 104B with a gate oxide film 106 disposed therebetween. The first-layered polysilicon gates 108A to 108N and second-layered polysilicon gates 110A to 110C serve as word lines WL1 to WLn. In the channel region below the first-layered polysilicon gates 108A to 108N, n-type diffusion layers 112 (which are hereinafter referred to as short regions) are selectively formed by ion-implantation to selectively convert the cell transistors into the depletion type. Likewise, in the channel region below the second-layered polysilicon gates 110A to 110C, n-type diffusion layers 114 (which are referred to as short regions) are selectively formed by ion-implantation to selectively convert the cell transistors into the depletion type.

The ion-implantation step for selectively converting the cell transistors into the depletion type is generally called a ROM-Implantation step, and in this specification, it is referred to as a ROM-Implantation step or simply a ROM-Implantation.

Now, the integration density of the semiconductor device and semiconductor memory device is further enhanced and the size of the transistors and the like tends to become smaller. As a matter of course, the integration density in the mask-ROM is significantly enhanced and it is strongly required to reduce the size of the cell transistors.

With the cell structure of two-layered gate electrode type shown in FIG. 1, a distance between the gates (word lines) ca be reduced and it is preferable to enhance the integration density of the cell transistors since the second-layered gates 110A to 110C are formed between the first-layered gates 108A to 108N.

However, particularly when a short region 112 for converting the cell transistor having the first-layered gates 108A to 108N into the depletion type is formed, a problem of preventing the high integration density which is explained below occurs.

That is, since the short region 112 is formed below the first-layered gates 108A to 108N, the ROM-Implantation for forming the short region 112 must be effected before the first-layered gates 108A to 108N are formed. Therefore, it becomes necessary to form the short region 112 larger than necessary so as to have a sufficiently large mask alignment margin so that the first-layered gates can be formed over the short region without fail.

FIG. 2 is a view for explaining an obstacle to enhancement of the integration density and shows an enlarged portion including the first- and second-layered gates.

As shown in FIG. 2, the length of the short region 112 in the gate length direction is equal to the sum of the gate length L1 of the first-layered gate 108 and the mask alignment margins M1 provided on both sides thereof. The mask alignment marging must be approximately 20–30% of the minimum lithography dimensions according to the present lithography technology (in the case of FIG. 2, the gate length L1 of the first-layered gate 108). If the object to be aligned is a diffusion layer such as the short region 112, the mask alignment margin M1 shown in the drawing is set to be 40 to 50% (which range is larger than 20–30%), since due to process fluctuation, the region may expand by the diffusion of impurities and the dimensions of the resist pattern used as a mask may be different from the intended dimensions.

As shown in FIG. 2, in the mask-ROM, the short regions 112 may be formed adjacent to each other depending on data to be stored. Therefore, it becomes necessary to separate the short regions from each other by a certain distance in order to prevent the depletion layers occurring around the short regions 112 from being made in contact with each other. The distance to be separated is set to l1 as shown in FIG. 2.

As is understood from the above description, a distance l2 between the first-layered gates 108 can be so set that l2=l1+2M1. Further, assuming that an insulation film 116 between the first-layered gate 108 and second-layered gate 110 is made sufficiently thin, then, l2 becomes substantially equal to the length L2 of the second-layered gate 110. That is, in the cell structure of second-layered gate electrode type, L1<<L2.

The explanation is made more concretely by using actual values.

L1 is set to 0.7 μm and l1 is set to 0.5 μm. The substantial mask alignment margin M1 is set to approx. 40% of L1, that is, approx. 0.3 μm.

Therefore, the distance l2 between the first-layered gates is approx. 1.1 μm. Further, if l2 is substantially equal to L2, L2 becomes longer than L1 by more than 50%.

Thus, in the mask-ROM having the cell structure of two-layered gate electrode type, the distance l2 between the first-layered gates becomes larger because of its manufacturing method, thereby making it difficult to enhance the integration density.

SUMMARY OF THE INVENTION

An object of this invention is to provide a mask-ROM manufacturing method capable of attaining higher integration density.

A mask-ROM manufacturing method comprising: a step (a) of insulatively forming a first conductive layer on a semiconductor substrate of a first conductivity type; a step (b) of forming a first material film which is inactive on said first conductive layer; a step (c) of forming a second material film which is active on said first material film; a step (d) of patterning said second material film; a step (e) of increasing the volume of said second material film by altering the material of said second material film patterned; a step (f) of patterning said first material film with said second material film having an increased volume as a mask and forming windows for doping first impurity in said first material film; a step (g) of selectively doping impurity of a second conductivity type from said first impurity doping window into said substrate through said first conductive layer; a step (h) of selectively altering the material of the surface of said first conductive layer with said patterned first material film used as a mask to selectively form a material altered region on the surface of said first conductive layer; a step (i) of patterning said first conductive layer with said material altered region used as a mask to form first-layered gates and form second impurity doping windows in said first conductive layer; a step (j) of selectively doping impurity of the second conductivity type from said second impurity doping window into said substrate; a step (k) of insulatively forming a second conductive layer over said first conductive layer and substrate; and a step (l) of patterning said second conductive layer to form second-layered gates.

According to the mask-ROM manufacturing method having the above steps, the first impurity doping window is formed by patterning the first material film with the second material film whose volume is increased in the step (f) used as a mask. Then, impurity of the second conductivity type, that is, impurity for converting the cell transistor into the depletion type is doped from the first impurity doping window into the substrate through the first conductive layer. After this, the material of the surface of the first conductive layer is selectively altered with the first material film which is patterned in the step (h) used as a mask to form the material altered region on the surface of the first conductive layer, and then the first conductive layer is patterned with the material altered region used as a mask to form first-layered gates in the step (i).

As described above, formation of the material altered region used as a mask for patterning the first-layered gate and the doping of impurity for converting the cell transistor having the first-layered gate into the depletion type can be effected by using the first material film having the same pattern as a mask. Therefore, the short region which lies below the first-layered gate and is used for converting the cell transistor into the depletion type can be formed without providing a mask alignment margin for the first-layered gate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENT

There will now be described an embodiment of this invention with reference to the accompanying drawings.

Figure 1:
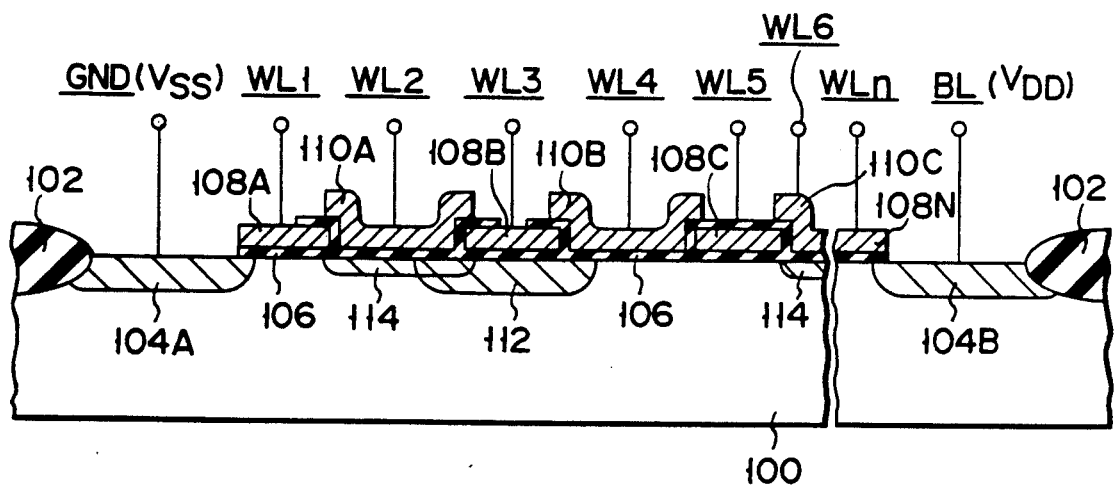
FIG. 1 is a cross sectional view of a cell of a NAND type mask-ROM of two-layered gate electrode structure.
Figure 2:
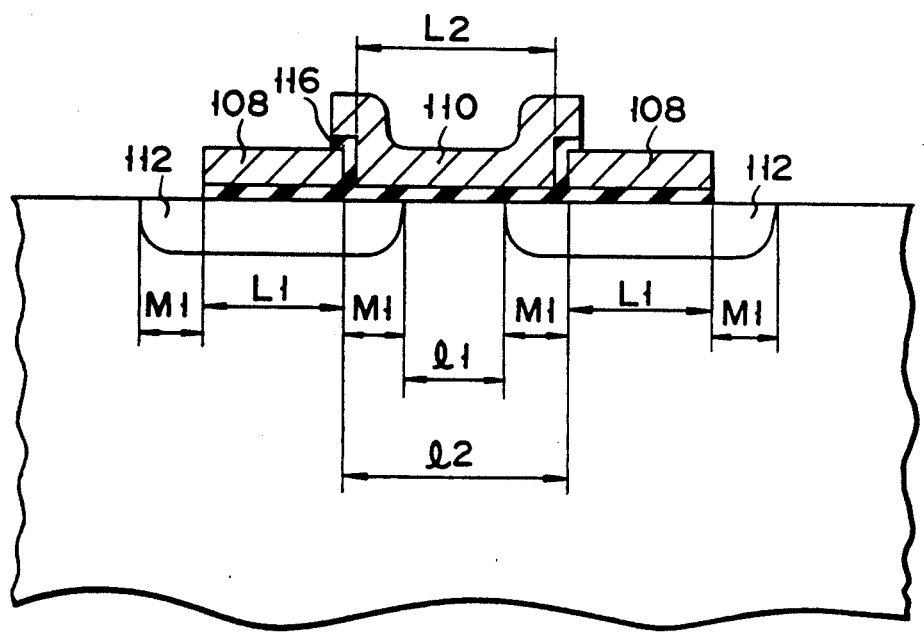
FIG. 2 is a view for explaining an obstruct to enhancement in the integration density of the conventional mask-ROM.
Figure 3:
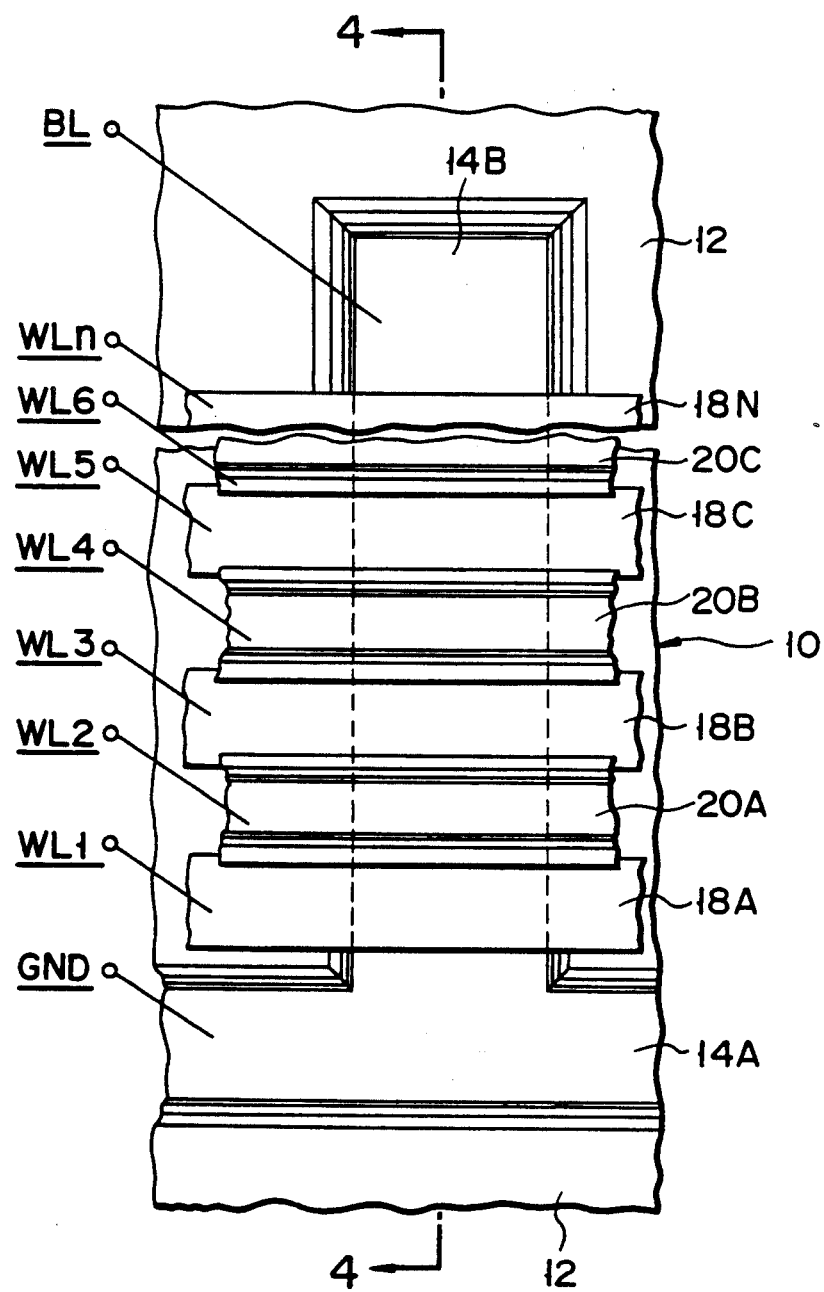
FIG. 3 is a plan view of a cell of a NAND type mask-ROM manufactured by a manufacturing method according to one embodiment of this invention.
Figure 4:
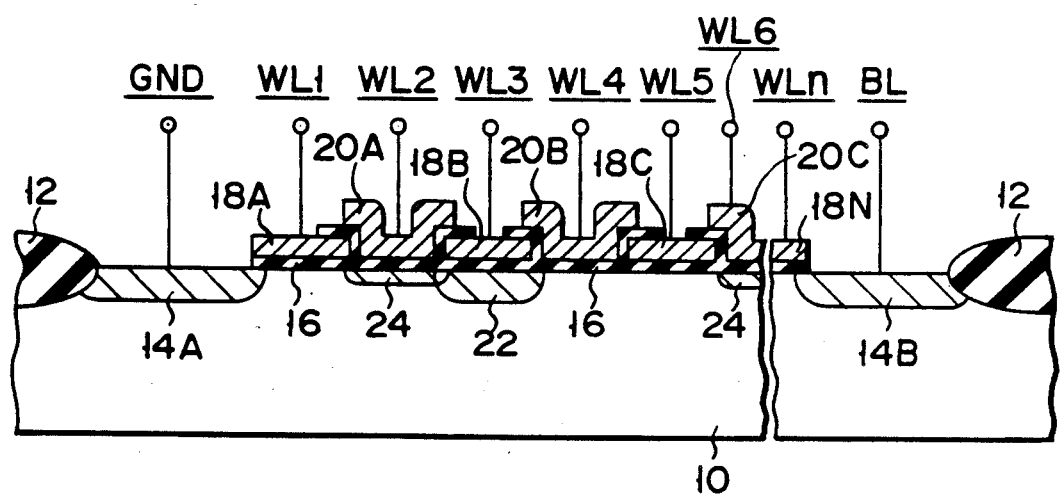
FIG. 4 is a cross sectional view taken along the line 4—4 in FIG. 3.

FIG. 3 is a plan view of a cell of a NAND type mask-ROM manufactured by a manufacturing method according to one embodiment of this invention and FIG. 4 is a a cross sectional view taken along the line 4—4 of FIG. 3.

As shown in FIGS. 3 and 4, the cell structure of a mask-ROM manufactured by a manufacturing method according to one embodiment of this invention basically corresponds to the cell structure of two-layered gate electrode type. For example, a field oxide film 12 is formed in the surface area of a p-type silicon substrate 10 for element isolation. In the isolated element region, n-type source/drain diffusion layers 14A and 14B are formed. The diffusion layer 14A is electrically coupled to a low potential (GND/VSS), for example, and the diffusion layer 14B functions as a bit line and is electrically coupled to a high potential (VDD), for example.

First-layered polysilicon gates 18A to 18N and second-layered polysilicon gates 20A to 20C are formed over that portion of the substrate area which lies between the diffusion layers 104A and 104B with a gate oxide film 16 disposed therebetween. The first-layered polysilicon gates 18A to 18N and second-layered polysilicon gates 20A to 20C serve as word lines WL1 to WLn. In the channel region below the first-layered polysilicon gates 18A to 18N, n-type short regions 22 are selectively formed by ion-implantation to selectively convert some of the cell transistors into the depletion type. Likewise, in the channel region below the second-layered polysilicon gates 20A to 20C, n-type short regions 24 are selectively formed by ion-implantation to selectively convert some of the cell transistors into the depletion type.

Figure 5:
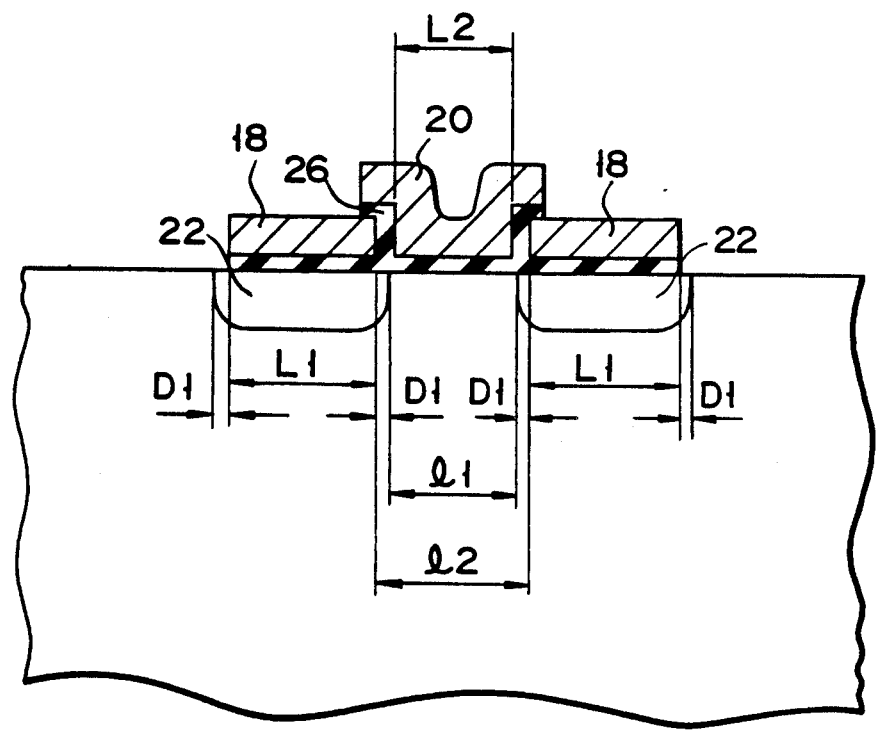
FIG. 5 is an enlarged view of a portion including first- and second-layered gates of a mask-ROM manufactured by a manufacturing method according to one embodiment of this invention.

FIG. 5 is a diagram showing an enlarged portion including the first- and second-layered gates of a mask-ROM manufactured by a manufacturing method according to one embodiment of this invention.

As shown in FIG. 5, the length of the short region 22 in the gate length direction is equal to the sum of the gate length L1 of the first-layered gate 18 and the extensions D1 due to diffusion of the short region 22 in the right and left directions. The extensions due to the diffusions is approx. 0.1 μm. A distance l1 is so set as to prevent the depletion layers occurring around the short regions 12 from being made in contact with each other.

A distance l2 between the first-layered gates 18 is so set that l2=l1+2D1. Further, an insulation film 26 between the first-layered gate 18 and second-layered gate 20 can be made sufficiently thin in the manufacturing method according to the embodiment of this invention, and l2 becomes substantially equal to the length L2 of the second-layered gate 20.

The explanation is made more concretely by using actual values.

L1 is set to 0.7 μm and l1 is set to 0.5 μm. Assume that the extension of diffusion D1 is 0.1 μm.

Therefore, the distance l2 between the first-layered gates is approx. 0.7 μm. Further, since l2 is substantially equal to L2, L2 becomes approximately equal to L1.

Next, a method for manufacturing the mask-ROM according to one embodiment of this invention is explained with reference to FIGS. 6A to 6P.

Figure 6A:
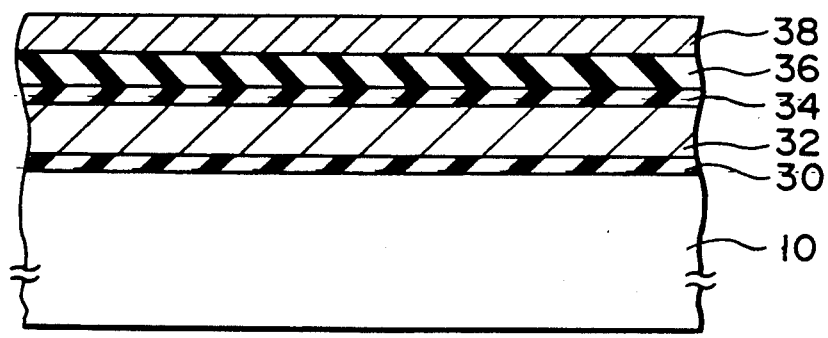
FIGS. 6A to 6P are cross sectional views showing enlarged portions each including the first- and second-layered gates of the mask-ROM shown in FIG. 4 in an order of the manufacturing process.

FIGS. 6A to 6P are cross sectional views showing enlarged portions each including the first- and second-layered gates of the mask-ROM shown in FIG. 4 in an order of the manufacturing process.

First, as shown in FIG. 6A, a field oxide film (not shown, but in FIG. 4, it is denoted by a reference numeral 12) is formed on a p-type silicon substrate 10. Then, a first silicon oxide film 30 which is used to form a gate insulation film of the first-layered gate is formed to a thickness of approx. 150 Å on the surface of the isolated element region by a thermal oxidation method, for example. After this, a first polysilicon film 32 which is used to form first-layered gates is formed to a thickness of approx. 4000 Å on the entire surface of the semiconductor structure by a CVD method, for example. Next, phosphorus is diffused into the first polysilicon film 32 by using POCl₃, for example, to make the same conductive (n-type). Then, a second silicon oxide film 34 is formed to a thickness of approx. 200 Å on the exposed surface of the polysilicon film 32 by a thermal oxidation method, for example. After this, a silicon nitride film 36 is formed to a thickness of approx. 1500 Å on the entire surface of the semiconductor structure by a CVD method, for example. In this case, the second oxide film 34 formed between the silicon nitride film 36 and the polysilicon film 32 is used as a pad film for making it easy to separate the silicon nitride film 36 from the polysilicon film 32. Next, a second polysilicon film 38 is formed to a thickness of approx. 2000 Å on the entire surface of the semiconductor structure by a CVD method, for example.

Figure 6B:
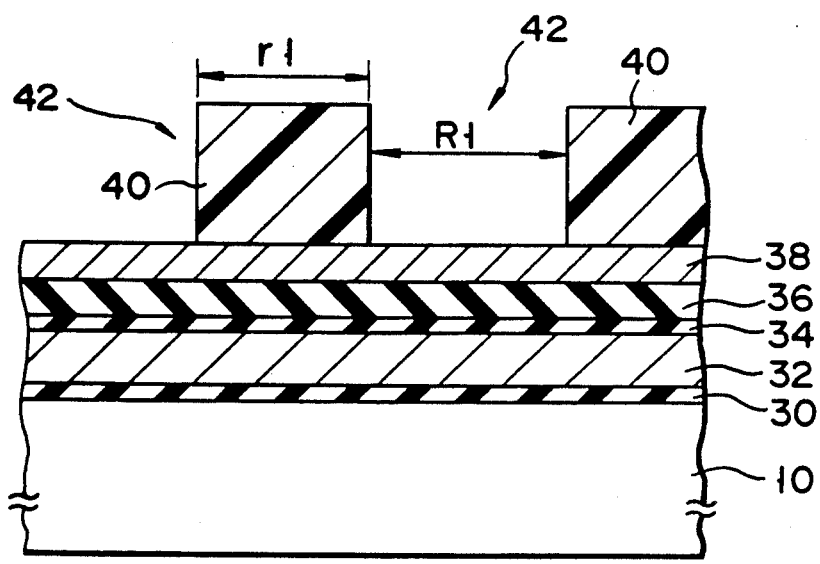

After this, as shown in FIG. 6B, a photoresist 40 is formed by coating on the entire surface of the semiconductor structure and openings 42 are formed in the photoresist 40 by a photo etching technique. The openings 42 correspond in position to the first-layered gates to be formed. The opening size R1 of the opening 42 may be the minimum size which can be obtained by the photo etching technique. Likewise, the pattern size r1 of the photoresist 40 may be the minimum size which can be obtained by the photo etching technique.

Figure 6C:
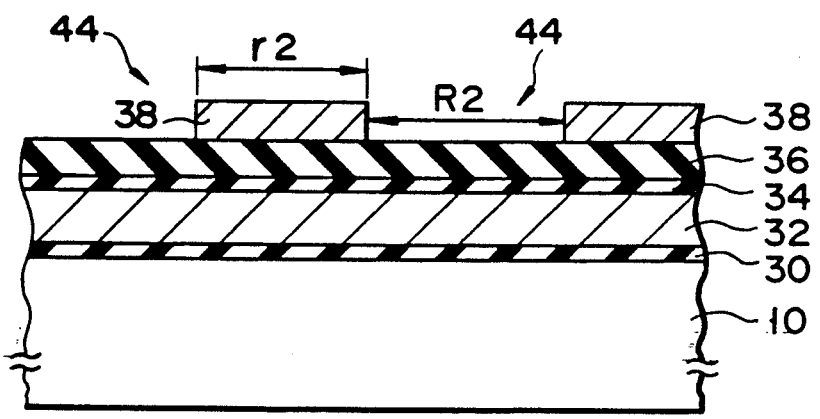

Then, as shown in FIG. 6C, the polysilicon film 38 is selectively etched by an RIE method, for example, with the photoresist 40 used as a mask to form openings 44 having an opening size R2. After this, the photoresist 40 is removed.

At this time, the pattern size r2 of the polysilicon film 38 is so set as to be approximately equal to r1. Further, the opening size R2 of the opening 44 is approximately equal to R1.

Figure 6D:
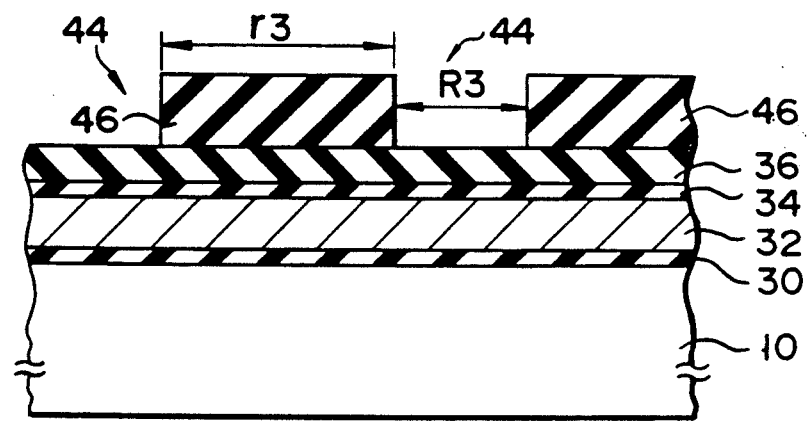

Next, as shown in FIG. 6D, the polysilicon film 38 lying on the silicon nitride film 36 is selectively and thermally oxidized with the silicon nitride film 36 used as an oxidation barrier to alter the same into a silicon oxide film 46. When the polysilicon film 38 is altered into the silicon oxide film 46, the volume of the polysilicon film 38 is increased. As a result, the pattern size r3 of the silicon oxide film 46 becomes larger than r2 and the opening size R3 of the opening 44 becomes smaller than R1.

Figure 6E:
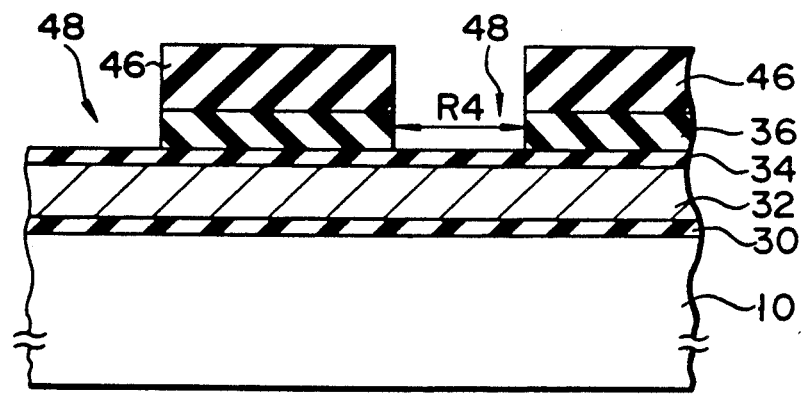

Then, as shown in FIG. 6E, the silicon nitride film 36 is selectively etched by an RIE method, for example, with the silicon oxide film 46 used as a mask to form openings 48 having an opening size R4. The opening 48 is used as an impurity ion-implanting window for forming a short region below the first-layered gate.

Figure 6F:
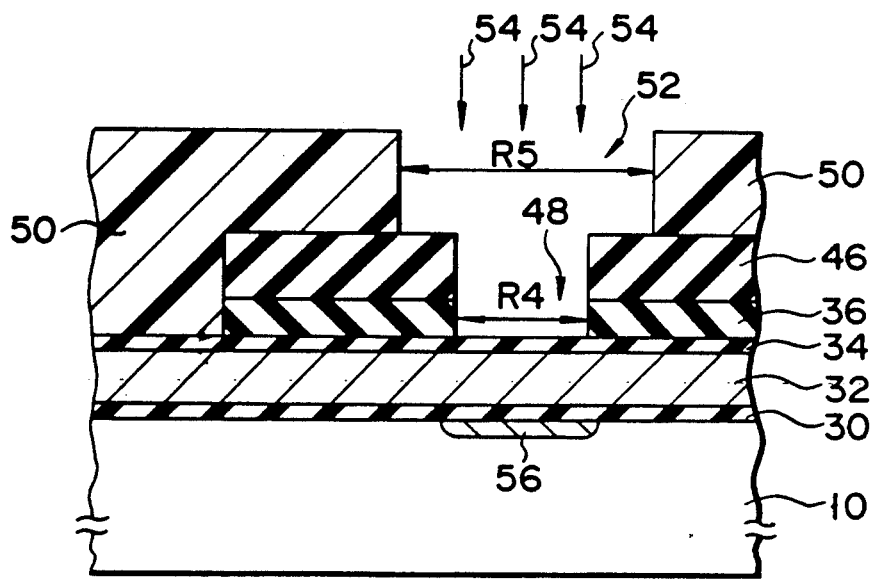

Next, as shown in FIG. 6F, a photoresist 50 is coated on the entire surface of the semiconductor structure and openings 52 are formed in the photoresist by a photo etching technique. The opening 52 is selectively formed according to data to be stored. That is, the opening 52 is formed in position in which a cell transistor having the first-layered gate and converted into the depletion type is to be formed. Since the the ion-implantation window (opening 48) is already formed, the opening 52 may be formed simply to expose the window used for the ion-implantation. That is, the photoresist 50 may be formed to cover the window (opening 48) which is not used for the ion-implantation and the opening size R5 of the opening 52 may be set to be larger than the opening size R4 of the opening 48. Then, Phosphorus ions 54 which are n-type impurity, for example, are ion-implanted into the p-type substrate 1 through the polysilicon film 32 and the like with the photoresist 50 and the like used as a mask (first ROM-Implantation).

In the drawing, a reference numeral 56 denotes a doped region of the substrate 10 into which phosphorus ions 54 are doped.

Figure 6G:
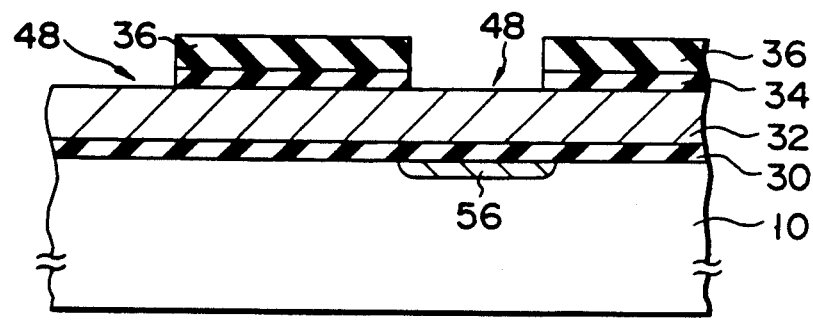

Then, as shown in FIG. 6G, the photoresist 50 and silicon oxide film 46 are removed.

Figure 6H:
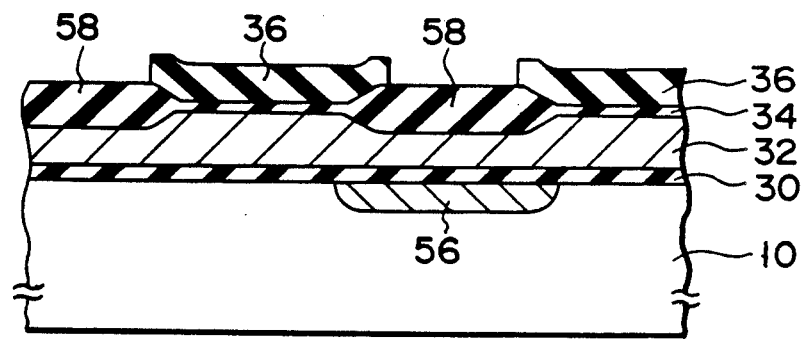

Next, as shown in FIG. 6H, the exposed surface of the polysilicon film 32 is selectively and thermally oxidized to form a silicon oxide film 58 to a thickness of approx. 1000 Å with the silicon nitride film 36 used as an oxidation barrier.

Figure 6I:
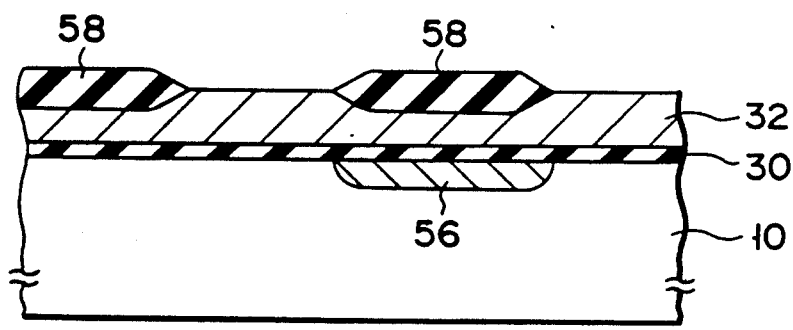

After this, as shown in FIG. 6I, the silicon nitride film 58 and silicon oxide film 34 are removed.

Figure 6J:
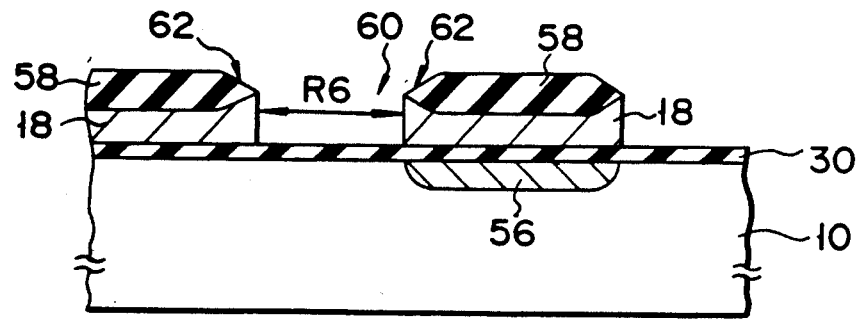

Then, as shown in FIG. 6J, the polysilicon film 32 is selectively etched by an RIE method, for example, to form a pattern of the first-layered gates 18 with the silicon oxide film 58 used as a mask. An opening 60 having the gate-to-gate size R6 is formed between the first-layered gates 18. The gate-to-gate size R6 becomes approximately equal to dimension r2 of the silicon nitride film 36 (dimension r2 is smaller than dimension r3 of the silicon oxide film 46) since the bird's beak 62 extends as a result of the step shown in FIG. 6H.

Next, as shown in FIG. 6K, a photoresist 64 is formed by coating on the entire surface of the semiconductor structure and openings 66 are formed in the photoresist 64 by a photo etching technique. Like the opening 52 shown in FIG. 6F, the opening 66 is selectively formed according to data stored. The opening 66 is formed in position corresponding to a cell transistor which has a second-layered gate and is converted into the depletion type. Since the ion-implantation window (opening 60) is already formed, the opening 66 may be formed simply to expose the window used for ion-implantation. That is, the photoresist 64 may be formed only to cover or close the window (opening 60) which is not used for ion-implantation and the opening size R7 of the opening 66 may be set to be larger than the opening size R6 of the opening 60. Then, arsenic ions 68 which are n-type impurity, for example, are ion-implanted into the p-type substrate 10 with the photoresist 64 and the like used as a mask (second ROM-Implantation).

In the drawing, a reference numeral 70 denotes a doped region of the substrate 10 into which arsenic ions 68 are doped.

Then, as shown in FIG. 6L, the photoresist 64 is removed.

Next, as shown in FIG. 6M, the silicon oxide film 58 and silicon oxide film 30 are removed. At this time, the silicon oxide film 30 is removed with the first-layered gate 18 used as a mask. As a result, that portion of the silicon oxide film 30 which lies directly under the first-layered gate 18 is left behind and is used as the gate oxide film 16.

Subsequently, as shown in FIG. 6N, a silicon oxide film 72 is formed on the exposed portions of the substrate 10 and on the first-layered gate 18 by a thermal oxidation method, for example. This thermal oxidation is carried out such that the silicon oxide film 72 formed on the exposed substrate portions has a thickness of approximately 150 Å. Since the silicon oxide film formed on the surface of the substrate 10 will be used as the gate oxide film of the second-layered gate, a reference numeral 16 is attached to the same in the drawing. Then, a third polysilicon film 74 which is used to form the second-layered gate is formed to a thickness of approx. 4000 Å on the entire surface of the semiconductor structure by a CVD method, for example. After this, phosphorus is diffused into the third polysilicon film 72 by using POCl₃, for example, to make the same conductive (n-type).

Then, as shown in FIG. 6O, a photoresist 76 is formed by coating on the entire surface of the semiconductor structure and openings 78 are formed in the photoresist 76 by a photo etching technique. The pattern of the photoresist 76 having the openings 78 formed therein corresponds to a pattern for forming the second-layered gate. The opening size R7 of the opening 78 may be the minimum size which can be obtained by the photo etching technique. Likewise, the pattern size r4 of the photoresist 76 may be the minimum size which can be obtained by the photo etching technique.

Next, as shown in FIG. 6P, the polysilicon film 74 is selectively etched by an RIE method, for example, to form a pattern corresponding to the second-layered gate 20 with the photoresist 76 used as a mask. Then, for example, a heat treatment is effected to activate the phosphorus and arsenic ions in the doped regions 56 and 70 in the substrate 10 so as to form n-type short regions 22 and 24.

After this, although not shown in the drawing, an interlayer insulation film is formed, a preset wiring layer is formed and a protection film is formed to complete the mask-ROM manufactured by the manufacturing method according to one embodiment of this invention.

According to the above manufacturing method, the opening 48 formed in the silicon nitride film 36 is substantially equal to the pattern of the first-layered gate 18. The short region 22 for converting the cell transistor of the first-layered gate into the depletion type can be formed in self-alignment with the silicon nitride film 36 having the opening 48. Further, the short region 24 for converting the cell transistor of the second-layered gate into the depletion type can be formed in self-alignment with the pattern of the first-layered gate. As a result, it is not necessary to provide a mask alignment margin for formation of the short regions 22 and 24.

Therefore, a mask-ROM in which a distance l2 between the first-layered gates is small as shown in FIG. 5 and which is suitable for high integration density can be manufactured. Further, since the distance l2 can be made smaller, it becomes possible to set the gate length L1 of the first-layered gate substantially equal to the second-layered gate length L2.

Figure 7A:
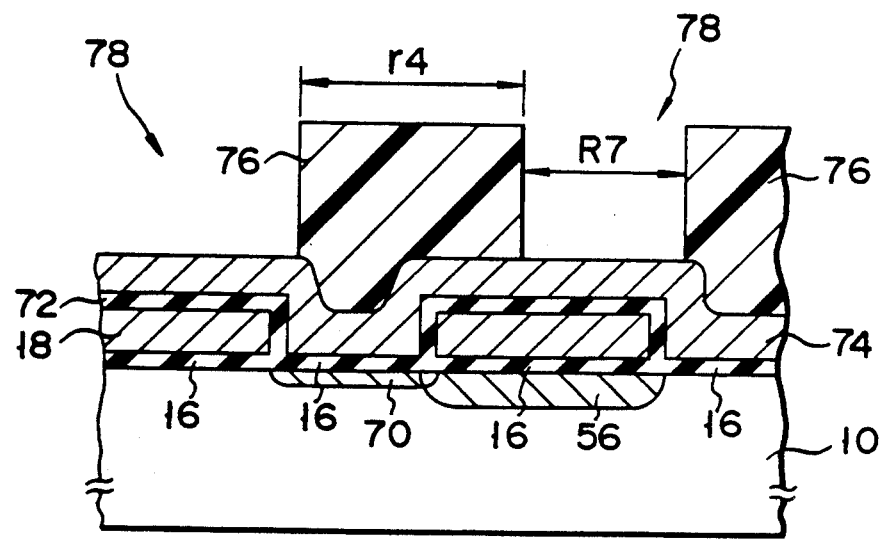
FIG. 7A is a cross sectional view showing a case wherein a photoresist is formed in deviated position in a step shown in FIG. 6O.
Figure 7B:
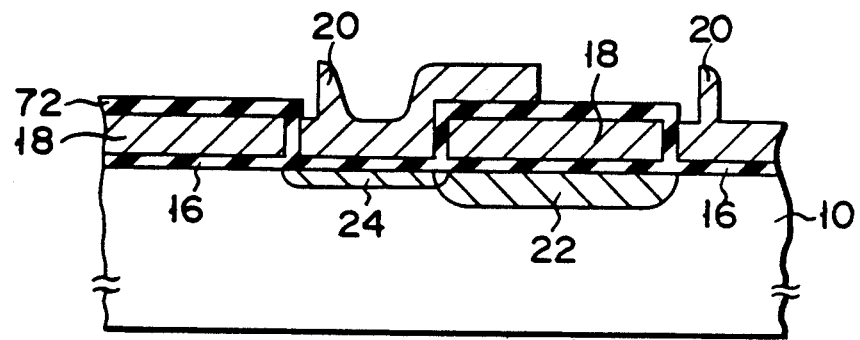
FIG. 7B is a cross sectional view of a structure obtained after an etching process is effected for the structure of FIG. 7A.

Next, a case wherein a mask misalignment has occurred at the time of patterning the second-layered gate is explained with reference to FIGS. 7A and 7B. FIG. 7A is a cross sectional view showing the case wherein the photoresist is formed in deviated position in the step of FIG. 6O, and FIG. 7B is a cross sectional view of a structure obtained after an etching process is effected for the structure of FIG. 7A. In FIGS. 7A and 7B, portions which are the same as those in FIGS. 6O and 6P are denoted by the same reference numerals, and only different portions are explained.

Assume that the mask misalignment has occurred in the step of FIG. 6O, for example, and the pattern of the photoresist 76 is formed to partly cover a step portion as shown in FIG. 7A. Then, if the photoresist 76 which partly covers the step portion is used as a mask to selectively etch the polysilicon film 74, a pattern of the second-layered gate 20 shown in FIG. 7B can be obtained.

In such a case, that portion of the polysilicon film 74 which is formed on the step portion is thicker than the remaining portion. Even if the mask for forming the second-layered gates 20 is misaligned but a little, it is only the thicker portion of the film 74 which is etched, never the thinner portion thereof formed between the first-layered gates 18. Hence, no offsets take place in the second-layered gates 20, even if the thicker portion of the film 74 is etched in excess. As a result, the yield of the mask-ROM is not lowered.

According to the invention, it is possible to form the first-layered gates 20 such that they have a width equal to the opening size R7 shown in FIG. 6O. If this is the case, the photoresist 76 overlaps the step portion of the second polysilicon film 74 even if the mask is misaligned, and no offsets occur in the second-layered gates 20.

Moreover, according to the invention, when the pattern size r1 and the opening size R1, both shown in FIG. 6B, are of a minimum value which photolithography can give them, the width of the first-layered gates 18 and the distance between any two adjacent gates 18 are nearly equal to the minimum value. Similarly, when the pattern size r4 and the opening size R7, both shown in FIG. 6O, are of a minimum value that photolithography can give them, the width of the second-layered gates 20 and the distance between any two adjacent first-layered gates 18 are nearly equal to the minimum value. Not only the first-layered gate pattern, but also the second-layered gate pattern can have the minimum size. Hence, the photoresist 76 overlaps the step portion of the second polysilicon film 74 even if the mask is misaligned, and no offsets occur in the second-layered gates 20.

Next, a first modification of the above embodiment is explained with reference to FIGS. 8A and 8B.

Figure 8A:
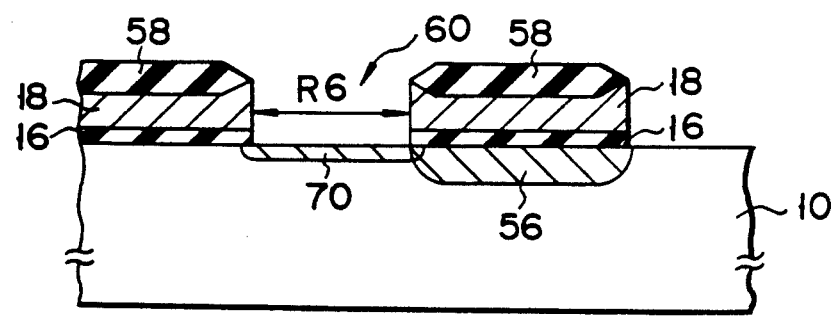
FIG. 8A is a cross sectional view showing a first modification of the embodiment of this invention and corresponding to FIG. 6M.
Figure 8B:
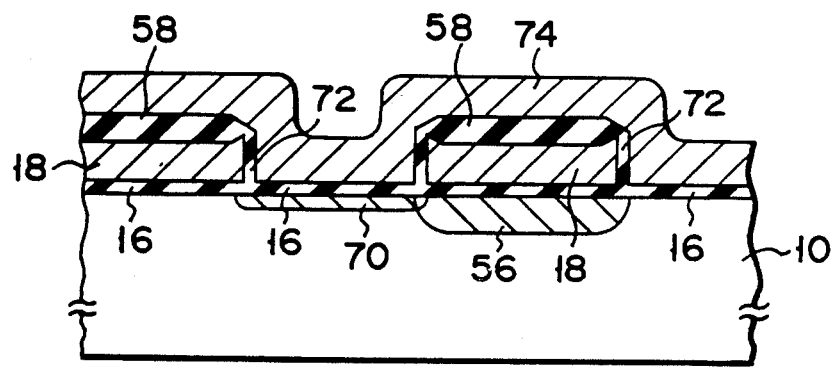
FIG. 8B is a cross sectional view showing a first modification of the embodiment of this invention and corresponding to FIG. 7M.

FIG. 8A is a cross sectional view corresponding to FIG. 6M and FIG. 8B is a cross sectional view corresponding to FIG. 6N.

As shown in FIG. 8A, it is not always necessary to completely remove the silicon oxide film 58 in the above embodiment, and it is possible to leave the silicon oxide film 58 on the first-layered gate 18. Then, the exposed surface of the polysilicon of the first-layered gate 18 is subjected to a thermal oxidation process, for example, to form the silicon oxide film 72. Next, as shown in FIG. 8B, a third-layered polysilicon film 74 which is used for forming second-layered gates is formed on the entire surface of the semiconductor structure.

As described above, the silicon oxide film 58 may be left on the first-layered gate 18.

Next, a second modification is explained.

Figure 9:
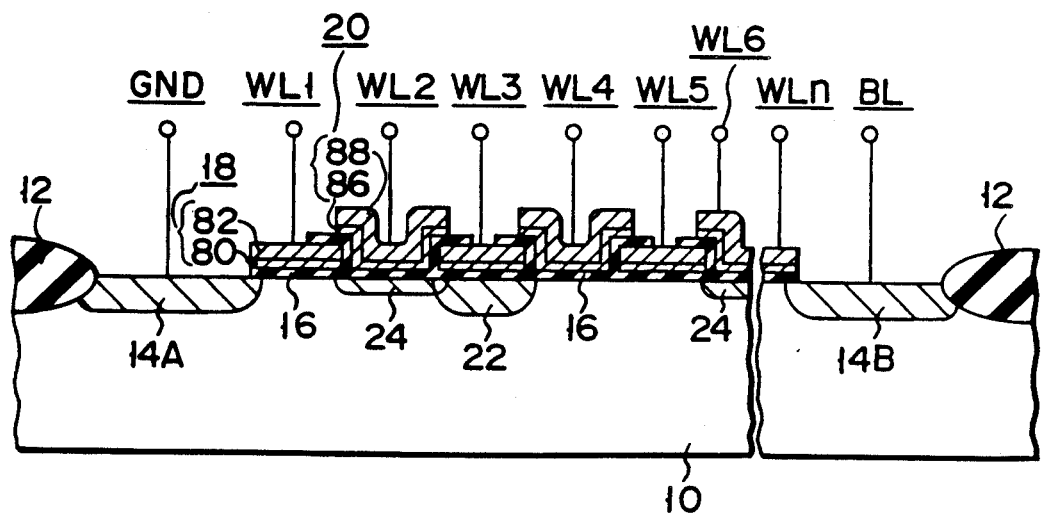
FIG. 9 is a cross sectional view showing a second modification of the embodiment of this invention and corresponding to FIG. 4.

In the above embodiment, the first-layered gate 18 and second-layered gate 20 are formed of polysilicon, but they can be formed of refractory metal silicide such as molybdenum-silicide or tungsten-silicide. In this case, a silicide film may be formed instead of the first polysilicon film 32 in the step shown in FIG. 6A and a silicide film may be formed instead of the third polysilicon film 74 in the step shown in FIG. 6N. Further as shown in FIG. 9, each of the first-layered gate 18 and second-layered gate 20 can be formed of a laminated film of a polysilicon film 80 and a silicide film 82. In this case, the polysilicon film 80 is formed instead of the first polysilicon film 3 in the step shown in FIG. 6A and then the silicide film 82 is formed. Further, the polysilicon film 80 may be formed instead of the third polysilicon film 74 in the step shown in FIG. 6N and then the silicide film 82 may be formed.

FIG. 9 is a cross sectional view corresponding to FIG. 4, and portions which are the same as those in FIG. 4 are denoted by the same reference numerals.

Additional advantages and modifications will readily occur to those skilled in the art. Therefore, the invention in its broader aspects is not limited to the specific details, and representative devices, shown and described herein. Accordingly, various modifications may be without departing from the spirit or scope of the general inventive concept as defined by the appended claims and their equivalents.

What is claimed is:

1. A mask-ROM manufacturing method comprising:
   a step (a) of insulatively forming a first conductive layer on a semiconductor substrate of a first conductivity type;
   a step (b) of forming a first material film which is inactive on said first conductive layer;
   a step (c) of forming a second material film which is active on said first material film;
   a step (d) of patterning said second material film;
   a step (e) of increasing the volume of said second material film by altering the material of said second material film patterned;
   a step (f) of patterning said first material film with said second material film having an increased volume as a mask and forming windows for doping first impurity in said first material film;
   a step (g) of selectively doping impurity of a second conductivity type from said first impurity doping window into said substrate through said first conductive layer;
   a step (h) of selectively altering the material of the surface of said first conductive layer with said patterned first material film used as a mask to selectively form a material altered region on the surface of said first conductive layer;
   a step (i) of patterning said first conductive layer with said material altered region used as a mask to form first-layered gates and form second impurity doping windows in said first conductive layer;
   a step (j) of selectively doping impurity of the second conductivity type from said second impurity doping window into said substrate;
   a step (k) of insulatively forming a second conductive layer over said first conductive layer and substrate; and
   a step (1) of patterning said second conductive layer to form second-layered gates.

2. A manufacturing method according to claim 1, wherein said first material film a difficult-to-oxidize material film.

3. A manufacturing method according to claim 2, wherein said difficult-to-oxidize material film is a silicon nitride film.

4. A manufacturing method according to claim 1, wherein said second material film is an easily-oxidizable material film.

5. A manufacturing method according to claim 4, wherein said easily-oxidizable material film is formed of polysilicon.

6. A manufacturing method according to claim 1, wherein said step (e) is an oxidizing step.

7. A manufacturing method according to claim 1, wherein said first conductive layer is formed of polysilicon.

8. A manufacturing method according to claim 1, wherein said first conductive layer is formed of silicide.

9. A manufacturing method according to claim 1, wherein said first conductive layer is formed of a laminated structure of films formed of polysilicon and silicide.

10. A manufacturing method according to claim 1, wherein said second conductive layer is formed of polysilicon.

11. A manufacturing method according to claim 2, wherein said second conductive layer is formed of silicide.

12. A manufacturing method according to claim 1, wherein said second conductive layer is formed of a laminated structure of films formed of polysilicon and silicide.

13. A manufacturing method according to claim 1, wherein said step (g) is effected by selectively closing said first impurity doping windows with a photoresist and selectively doping impurity of the second conductivity type from the window which is not closed into said substrate through said first conductive layer.

14. A manufacturing method according to claim 1, wherein said step (j) is effected by selectively closing said second impurity doping windows with a photoresist and selectively doping impurity of the second conductivity type from the window which is not closed into said substrate.

15. A manufacturing method according to claim 1, wherein said step (h) is an oxidizing step.

16. A manufacturing method according to claim 1, further comprising a step (m) of forming a third material film on said first conductive layer, said step (m) being effected between said steps (a) and (b).

17. A manufacturing method according to claim 16, wherein said third material film is a film that makes it easy to remove said first material film from said first conductive layer.

18. A manufacturing method according to claim 16, wherein said third material film is a silicon oxide film.

* * * * *